(12) United States Patent
Zojer

(10) Patent No.: US 9,007,103 B2
(45) Date of Patent: Apr. 14, 2015

(54) SWITCH CIRCUIT ARRANGEMENTS AND METHOD FOR POWERING A DRIVER CIRCUIT

(71) Applicant: Infineon Technologies Austria AG, Villach (AT)

(72) Inventor: Bernhard Zojer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/956,399

(22) Filed: Aug. 1, 2013

(65) Prior Publication Data

US 2015/0035581 A1    Feb. 5, 2015

(51) Int. Cl.
  *H03K 17/687*    (2006.01)
  *H03K 17/04*    (2006.01)
  *H03K 17/16*    (2006.01)

(52) U.S. Cl.
  CPC ...................................... *H03K 17/16* (2013.01)

(58) Field of Classification Search
  None
  See application file for complete search history.

(56) References Cited

U.S. PATENT DOCUMENTS

| 6,236,248 | B1 * | 5/2001 | Koga .............................. 327/112 |
| 7,088,150 | B2 * | 8/2006 | Balhiser et al. ............... 327/108 |
| 7,759,985 | B2 * | 7/2010 | Yanagishima ................ 327/108 |
| 8,508,302 | B2 * | 8/2013 | Fujita et al. ................... 330/310 |
| 8,558,584 | B2 * | 10/2013 | Draxelmayr et al. ......... 327/108 |
| 8,710,873 | B2 * | 4/2014 | Barrenscheen et al. ...... 327/108 |
| 2003/0160638 | A1 * | 8/2003 | Hirose ........................... 327/108 |
| 2010/0283515 | A1 | 11/2010 | Kelley et al. |

OTHER PUBLICATIONS

Kelley et al."Improved Two-Stage DC-Coupled Gate Driver for Enhancement-Mode SiC JFET", APEC 2010, pp. 1838-1841.

* cited by examiner

*Primary Examiner* — Lincoln Donovan
*Assistant Examiner* — Terry L Englund

(57) ABSTRACT

In various embodiments, a switch circuit arrangement may include a switch circuit, a driver circuit and a supply circuit. The driver circuit may be configured to control the switch circuit. The supply circuit may be configured to power the driver circuit. The supply circuit may include a first circuit configured to modify an output impedance of the supply circuit to have a first impedance when the driver circuit controls the switch circuit to be in a conducting state and to have a second impedance when the driver circuit controls the switch circuit to change from a non-conducting state to the conducting state.

8 Claims, 4 Drawing Sheets

SWITCH CIRCUIT ARRANGEMENTS AND METHOD FOR POWERING A DRIVER CIRCUIT

TECHNICAL FIELD

Various embodiments relate generally to switch circuit arrangements and methods for powering a driver circuit.

BACKGROUND

Switch transistors, such as for example power metal oxide semiconductor field effect transistors (power MOSFETs) or insulated gate bipolar transistors (IGBTs), may be used in power electronics. These transistors require almost no gate current in the ON-state (or conducting state). Such power transistors are usually driven with low-ohmic (or low impedance) drivers (for example voltage sources) to achieve short switching times in order to keep switching power losses low.

Further, power transistors which have a gate-source characteristic similar to that of a pn-junction may be used. Examples of such transistors include junction field effect transistors (Junction-FETs) and high electron mobility transistors (HEMTs). Examples of junction field effect transistors may include transistors with wide bandgap material such as for example silicon carbide (SiC) transistors. Examples of high electron mobility transistors may include transistors with wide bandgap material such as for example gallium nitride (GaN) transistors. In case such power transistors are driven by a voltage source, variations in the voltage of the voltage source and in the input characteristic of the transistor, for example due to temperature variation or parameter variation, may result in a substantial change in the operating point of the transistor, which is usually undesired. Ideally, such transistors would be operated in their ON-states using a low constant current. For switching from the OFF-state (or non-conducting state) to the ON-state, a low ohmic resistance driving is desired to achieve short switching times in order to keep switching power losses low. It would be desirable to provide such a driver circuit for the operation of these transistors.

SUMMARY

In various embodiments, a switch circuit arrangement is provided. The switch circuit arrangement may include a switch circuit, a driver circuit and a supply circuit. The driver circuit may be configured to control the switch circuit. The supply circuit may be configured to power the driver circuit. The supply circuit may include a first circuit configured to modify the output impedance of the supply circuit to have a first impedance when the driver circuit controls the switch circuit to be in a conducting state and to have a second impedance when the driver circuit controls the switch circuit to change from a non-conducting state to the conducting state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
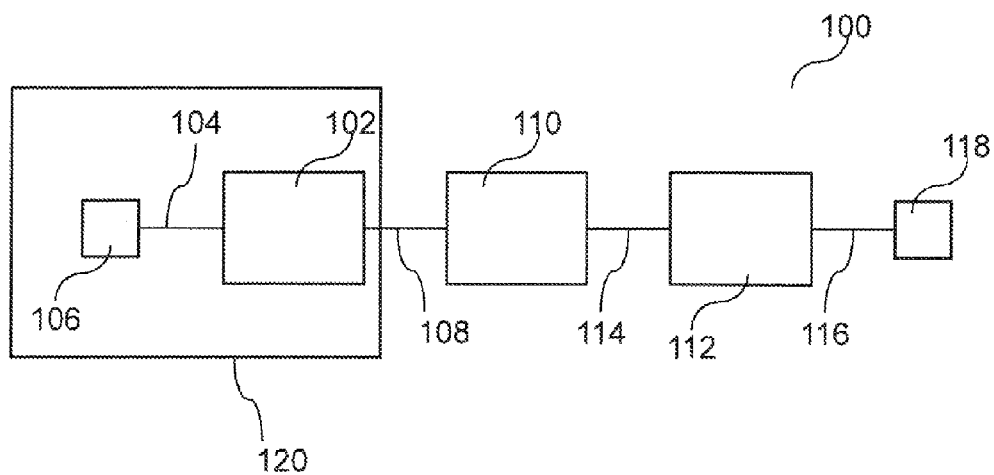
FIG. 1 shows a switch circuit arrangement in accordance with various embodiments.

FIG. 1 shows a switch circuit arrangement 100 in accordance with various embodiments. The circuit arrangement 100 may include a supply circuit 120, a first circuit 102, a driver circuit 110, a switch circuit 112 and a load circuit 118.

The supply circuit 120 may be configured to power the driver circuit 110. In various embodiments, the supply circuit 120 may include the first circuit 102 which may be configured to vary the output impedance of the supply circuit 120. In various embodiments, the impedance may be a first impedance when the driver circuit 110 controls the switch circuit 112 to be in a conducting state (or an ON-state). In various embodiments, the impedance may be a second impedance when the driver circuit 110 controls the switch circuit 112 to change from a non-conducting state (or OFF-state) to the conducting state. Typically in switching applications the duration of transients between states is much shorter than the duration of the states themselves or, in other words, the spectrum of the transients contains much higher frequencies than the switching frequencies, for example by a factor of about 1000. The intended behavior of the supply impedance may therefore be achieved by a frequency dependent impedance.

In various embodiments, the first impedance is larger than the second impedance. For example, the first impedance may be larger by a factor of 100 to 1000 than the second impedance. In various embodiments, the first circuit 102 may include a resistance configured to limit a current flow in the conducting state. In various embodiments, the first circuit 102 may include a frequency dependent element configured to provide a low impedance when changing from the non-conducting state to the conducting state and to have a high impedance during the conducting state. In various embodiments, the frequency dependent element may be a capacitor. The first circuit 102 may be a parallel connection of a capacitor and a resistor.

In various embodiments, the supply circuit 120 may further have a voltage source 106 which may provide a supply voltage 104, for example a positive voltage. The supply voltage 104 may be electrically coupled to the first circuit 102. The first circuit 102 may output a driver supply voltage 108 which is derived from the supply voltage 104. The driver supply voltage 108 may be a positive driver supply voltage, for example if the supply voltage 104 is positive. In various embodiments, the supply circuit 120 may be regarded as a series connection of a voltage source and a variable impedance, where the impedance depends on the state or the change of state of the switch circuit 112. Or, the supply circuit 120 may be regarded as a parallel connection of a current source and a variable impedance, where the impedance depends on the state or the change of state of the switch circuit 112.

The first circuit 102 is not located between an output of the driver circuit 110 and a control terminal of the switch circuit 112. Rather, it is located between the power supply circuit 120 and the power supply input of a driver circuit 110. Therefore, any parasitic capacitances of the first circuit 102 will not influence the driving of the switching elements in the switch circuit 112. In various embodiments, the driver circuit 110 and the switch circuit 112 may be accommodated in a common package, for example in a system in package (SiP) or a driver MOSFET (DrMOS) arrangement.

The driver circuit 110 may be configured to control switch circuit 112. The driver circuit 110 may include a driver element (not shown in FIG. 1). The driver element (which may also be referred to as sub-driver) may include at least one driver transistor, which may include or be implemented as a field effect transistor and/or bipolar transistor. The driver supply voltage 108 may be provided to the driver element. A driver element output of the driver element may be coupled to a control terminal of a transistor switch. In other words, the driver circuit 110 may be configured to provide a switch control signal 114 to control a switch circuit 112.

In various embodiments, the switch circuit 112 may include a switch. The switch of the switch circuit 112 may include a transistor switch. The transistor switch may include a power transistor switch such as for example a power semiconductor transistor switch. In various embodiments, the power transistor may have a non-isolated control input. In various embodiments, the power transistor may have a diode like current-voltage control input characteristic. In various embodiments, the power transistor may be configured to draw a current during the conducting state (ON-state). Various examples for a power transistor switch may include a wide bandgap transistor without isolated gate such as e.g. a junction field effect transistor (JFET), a high electron mobility transistor (HEMT), a gallium nitride (GaN) transistor, and/or a silicon carbide (SiC) transistor. In various embodiments, the power transistor may be an N-type power transistor.

In various embodiments, the switch circuit 112 may be coupled, for example via a driver circuit output, to the driver circuit 110. The driver circuit 110 may control the switching of the switch circuit 112 by means of the switch control signal 114. To do this, the driver 110 may generate and provide the switch circuit control signal 114 and may supply the same to an input of the switch circuit 112. The switch circuit 112 may be configured to provide at least one switch circuit output signal 116 in response to the received switch circuit control signal 114. The at least one switch circuit output signal 116 may be a power supply voltage for the load circuit 118, for example.

The switch circuit 112 may be configured as a bridge circuit, e.g. as a half bridge circuit 112 or a full bridge circuit 112. Other configurations of the switch circuit 112 may be provided in alternative embodiments as desired, for example a single power transistor may be used.

Figure 2:
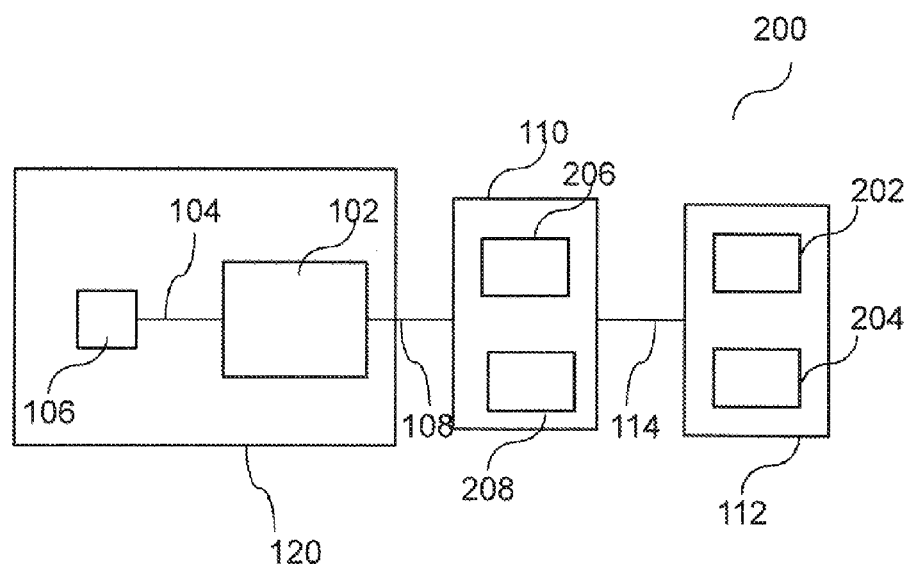
FIG. 2 shows a switch circuit arrangement in accordance with various embodiments.

FIG. 2 shows a driver circuit arrangement 200 in accordance with various embodiments. The driver circuit arrangement 200 as shown in FIG. 2 may be similar to the switch circuit arrangement 100 as shown in FIG. 1. Therefore, the same reference numbers may be used for the same elements and the respective description of the elements of the switch circuit arrangement 100 as shown in FIG. 1 may also apply to these elements.

The switch circuit arrangement 200 may include a first circuit 102 configured to receive the supply voltage 104 and to provide the driver supply voltage 108. Driver circuit 110 may be coupled to an output of the first circuit 102 to receive the driver supply voltage 108. Driver circuit 110 may be coupled to the switch circuit 112 and may be configured to control the switch circuit 112.

In various embodiments, the switch circuit 112 may be configured as a half bridge circuit. In other words, the switches or switching elements 202, 204 may be connected to form a bridge circuit such as e.g. a half bridge circuit. The half bridge circuit may include a series connection of a first switching element 202 and a second switching element 204. As described above, the switch circuit 112 may include at least one power transistor switch, such as one as described above. In various embodiments, each switching element 202, 204 may include at least one power transistor switch. In various embodiments, the first switching element 202 and a second switching element 204 may be configured to draw a current in their respective conducting states (or ON states).

Driver circuit 110 may be configured to provide switch control signals 114 to control the half bridge circuit. It may include a first driver element 206 and a second driver element 208. The first driver element 206 may be coupled to the supply circuit 120 and be configured to drive the first switching element 202. The second driver element 208 may be coupled to the supply circuit 120 and be configured to drive the second switching element 204.

The driver circuit 110 may be configured to control the half bridge circuit, for example via the first driver element 206 and the second driver element 208, such that in a first phase the first switching element 202 is in a conducting state (or ON-state or conducting in a steady state) and the second switching element 204 is in a non-conducting state (or OFF-state). It may further be configured to control the half bridge circuit such that in a second phase the first switching element 202 is in a non-conducting state (or OFF-state) and the second switching element 204 is in a conducting state (or ON-state or conducting in a steady state).

In various embodiments, the driver circuit 110 may include a voltage converter circuit, for example a bootstrap circuit or a DC-DC converter. The voltage converter circuit may be coupled to the supply circuit 120 to receive the driver supply voltage 108 and may be configured to drive the second driver element 208.

The supply circuit 120 may include a first circuit 102 configured to power the first driver element 206 and the second driver element 208. The first circuit 102 may be configured to have a first impedance during the first phase and the second phase and to have an impedance lower than the first impedance during a change from the first phase to the second phase and during a change from the second phase to the first phase.

In various embodiments, the supply circuit 120 may include a series connection of a voltage source 106 and the first circuit 102. The first circuit 102 may be a parallel connection of a capacitor and a resistor.

Figure 3:
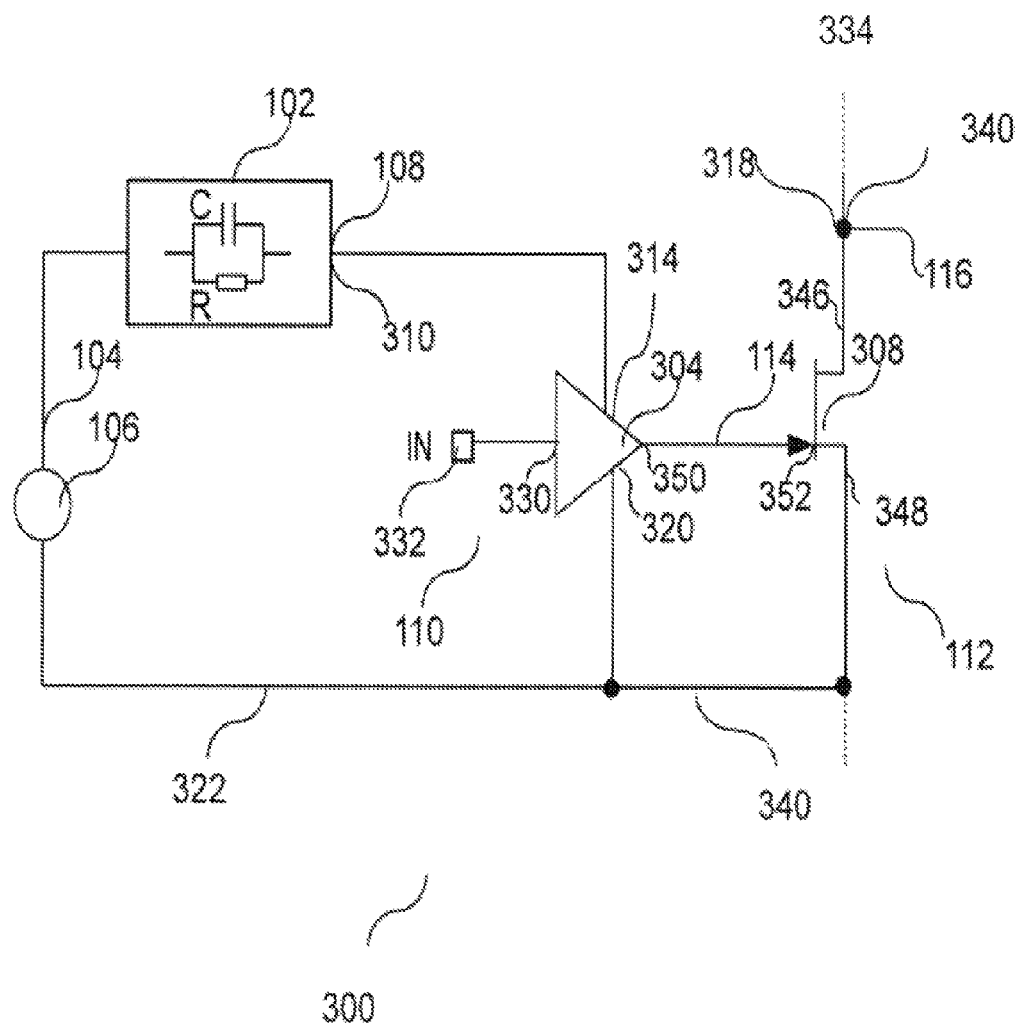
FIG. 3 shows an implementation of the switch circuit arrangement of FIG. 1 in accordance with various embodiments.

FIG. 3 shows an implementation 300 of the circuit arrangement 100 of FIG. 1 and of portions of the circuit arrangement 200 of FIG. 2 in accordance with various embodiments. The same reference numbers may be used for the same elements and the respective description of the element may also apply to these elements.

In various embodiments, the first circuit 102 may include a parallel RC circuit. The first circuit 102 may receive the positive supply voltage 104 from the power supply 106. The first circuit (e.g. the RC circuit) 102 may thus be connected into the voltage supply of the driver circuit 110, which may include a sub-driver (also referred to as a driver element) 304, wherein e.g. exactly one driver element 304 may be provided to implement a respective sub-driver 304. The driver 110 may be a driver circuit 110 for the switch circuit 112, e.g. for the switch 308 (e.g. transistor switch 308) of the switch circuit 112, which may in various embodiments be configured as part of a half bridge circuit.

As shown in FIG. 3, the driver supply voltage 108 may be provided for the sub-driver 304 provided in the switch circuit arrangement 300.

In the implementation 300 as shown in FIG. 3, the sub-driver 304 may be provided as a (sub) driver for transistor switch 308 of the switch circuit 112. The sub-driver 304 may be connected to a switch 308 of the switch circuit 112.

In various embodiments, an output 310 of the first circuit 102 may be coupled to a first supply voltage terminal 314 of the sub-driver 304. A second supply voltage terminal 320 of the sub-driver 304 may be coupled to a reference potential 322. A control terminal 330 of the sub-driver 304 may be coupled to a control input 332 receiving a control signal IN. The switch 308 (e.g. the transistor switch 308) may be coupled between a node 318 and the reference potential 322. A first controlled terminal (e.g. a drain terminal) 346 of the switch 308 (e.g. the transistor switch 308) may be coupled to the node 318 of the switch circuit 112 and a second controlled terminal (e.g. a source terminal) 348 of the switch 308 (e.g. the transistor switch 308) may be coupled to the reference potential 322. Furthermore, a driver output 350 of the sub-driver 304 may be coupled to a control terminal (e.g. a gate terminal) 352 of the switch 308 (e.g. the transistor switch 308).

The implementation 300 as shown in FIG. 3 may be used in a low side switch circuit arrangement or in a high side switch circuit arrangement.

When it is used in a low side switch circuit arrangement, a load circuit 118 may be connected with the first controlled terminal 346. The reference potential 322 may be connected to a ground potential.

When it is used in a high side switch circuit arrangement, a load circuit 118 may be connected with the second controlled terminal 348. The node 318 may be connected to a supply voltage 334. A level shifter may be provided for the input signal IN at the control input 332.

The implementation 300 as shown in FIG. 3 may be used in a circuit arrangement having a combination of both a high side switch and a low side switch circuit arrangement.

It should be noted that, in various embodiments, a resistor (not shown), which may have a base resistance of a few ohms in a steady state of the operation of the implementation 300, may optionally be connected between the driver output 350 of the sub-driver 304 and the control terminal 352 of the switch 308.

In various embodiments, the switch circuit 112 may be controlled by control signal IN to turn switch 308 ON and OFF during a respective switching period Tsw. In a high side switch circuit arrangement, a load circuit 118 (not shown) may then be connected for some time Ton to the supply potential 334 and may be disconnected for the rest of the switching period Ton=Tsw−Toff. Similarly, in a low side switch circuit arrangement, a load circuit 118 (not shown) may be connected for some time Ton to the reference potential 340, which may be at a ground potential and may be disconnected for the rest of the switching period Ton=Tsw−Toff. Ton and Toff may define a duty cycle to provide an average current for the load circuit 118. The switching period Tsw may be chosen small enough (or, in other words, the switching frequency fsw=1/Tsw may be chosen high enough) that the switching is not noticed by the load circuit 118.

During time period Ton, the switch 308 is conducting and a corresponding current will flow into its control terminal 352. During time period Toff, the switch 308 is non-conducting and no current will flow into its control terminal 352.

Figure 4:
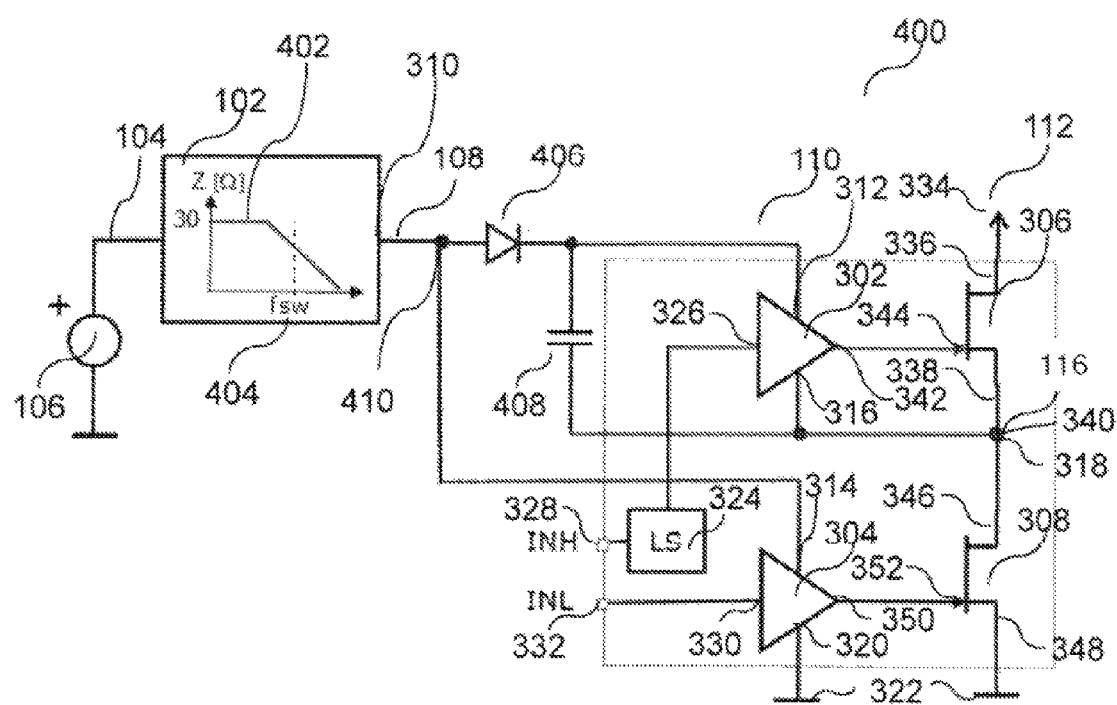
FIG. 4 shows an implementation of the switch circuit arrangement of FIG. 2 in accordance with various embodiments.

FIG. 4 shows an implementation 400 of the embodiment 200 shown in FIG. 2. As shown in FIG. 4, the implementation 400 of the switch circuit arrangement may be configured as a half bridge driver circuit arrangement having a supply voltage 108 from the first circuit 102. The description of the first circuit 102 in conjunction with FIGS. 1 to 3 may also apply to this embodiment. Similarly, the description of the first circuit 102 in this implementation may also apply to other embodiments described in conjunction with FIGS. 1 to 3. In various embodiments, the implementation 400 may include a high side switch and a low side switch which share a common first circuit 102 and a common voltage source 106.

The first circuit 102 may include a parallel RC circuit. The first circuit 102 may receive the positive supply voltage 104 from the power supply 106. The first circuit (e.g. the RC circuit) 102 may thus be connected into the (common) voltage supply of the driver circuit 110, which may include a plurality of sub-drivers (also referred to as driver elements) 302, 304 (wherein e.g. (exactly) one driver element 302, 304 may be provided to implement a respective sub-driver 302, 304). The driver 110 may be a driver circuit 110 for the switch circuit 112, e.g. for the plurality of switches 306, 308 (e.g. transistor switches 306, 308) of the switch circuit 112, which may be configured as a half bridge circuit.

As shown in FIG. 4, the driver supply voltage 108 may be provided for all sub-drivers 302, 304 provided in the switch circuit arrangement 300 (in general, more than two sub-drivers 302, 304, may be provided, e.g. three, four, five, six, or even more).

In the implementation 400 as shown in FIG. 4, a first sub-driver 302 may be provided as a (sub) driver for a first transistor switch 306 (e.g. a high side switch 306) of the switch circuit 112, and a second sub-driver 304 may be provided as a (sub) driver for a second transistor switch 308 (e.g. a low side switch 308) of the switch circuit 112.

In various embodiments, an output 310 of the first circuit 102 may be coupled to a first supply voltage terminal 312 of the first sub-driver 302 as well as to a first supply voltage terminal 314 of the second sub-driver 304. A second supply voltage terminal 316 of the first sub-driver 302 may be coupled to a common node 318, with which also a controlled terminal 338 of the first transistor switch 306 and a controlled terminal 346 of the second transistor switch 308 are coupled. Illustratively, the second supply voltage terminal 316 of the first sub-driver 302 may be coupled to the common node 318 of the series connection of the first transistor switch 306 and the second transistor switch 308. Furthermore, a second supply voltage terminal 320 of the second sub-driver 304 may be coupled to a reference potential 322 such as e.g. to ground 322.

Moreover, a level shifter 324 may be provided. The level shifter 324 may be configured to shift the control voltage provided to a control terminal 326 of the first sub-driver 302, e.g. into positive potential direction. The level shifter 324 may be connected between a high side control input 328 receiving a high side control signal INH and the control terminal 326 of the first sub-driver 302.

A control terminal 330 of the second sub-driver 304 may be coupled to a low side control input 332 receiving a low side control signal INL.

Each sub-driver 302, 304 may be connected to a respective switch 306, 308 of the switch circuit 112. The switches 306, 308 (e.g. the transistor switches 306, 308) may be coupled in series between a supply potential (e.g. Vdd) 334 and the reference potential 322. By way of example, a first controlled terminal (e.g. a drain terminal) 336 of the first switch 306 (e.g. the first transistor switch 306) may be coupled to the supply potential (e.g. Vdd) 334 and a second controlled terminal (e.g. a source terminal) 338 of the first switch 306 (e.g. the first transistor switch 306) may be coupled to an output 340 (which may be electrically conductively coupled to the common node 318 of the switch circuit 112 at which the switch circuit output signal 116 is provided.

The output 340 of the switch circuit 112 may also be directly coupled (be on the same potential as) the second supply voltage terminal 316 of the first sub-driver 302. Furthermore, a driver output 342 of the first sub-driver 302 may be coupled to a control terminal (e.g. a gate terminal or a base terminal) 344 of the first switch 306 (e.g. the first transistor switch 306).

It should be noted that a resistor (not shown), which may have a base resistance of a few ohms in a steady state of the operation of the implementation 400, may optionally be connected between the driver outputs 342, 350 of the first and second sub-driver 302, 304 and the respective control terminal 344, 352 of the first and second switch 306, 308.

Moreover, a first controlled terminal (e.g. a drain terminal) 346 of the second switch 308 (e.g. the second transistor switch 308) may be coupled to the output 340 of the switch circuit 112 and a second controlled terminal (e.g. a source terminal) 348 of the second switch 308 (e.g. the second transistor switch 308) may be coupled to the reference potential 322 (e.g. to ground potential 322). Furthermore, a driver output 350 of the second sub-driver 304 may be coupled to a control terminal (e.g. a gate terminal or a base terminal) 352 of the second switch 308 (e.g. the second transistor switch 308).

The switch circuit 112 may be controlled, for example by high side control signals INH and low side control signals INL, such that alternately one of the two switches 306, 308 is switched on and the other one of the two switches 308, 306 is switched off during a respective switching period Tsw. A load circuit 118 (not shown) connected to output 340 will then be connected for some time Toff to reference ground 322 and for the rest of the switching period Ton=Tsw−Toff to the supply potential 334. The two switches 306, 308 may be operated in a push-pull manner Ton and Toff may define a duty cycle to provide an average current for the load circuit 118. The switching period Tsw may be chosen small enough (or the switching frequency fsw=1/Tsw may be chosen high enough) that the switching is not noticed by the load circuit 118. Preferably, it is desired that the two switches 306, 308 are not conducting at the same time as this would short-circuit the supply voltage 334 and the reference potential 322.

During time period Ton, a first one of the two switches, for example 306, is conducting and a corresponding current will flow into its control terminal 344 while a second one of the two switches, for example 308, is non-conducting and no current will flow into its control terminal 352. During time period Toff, the first switch 306 is non-conducting and no current will flow into its control terminal 344, while the second switch 308 is conducting and a corresponding current will flow into its control terminal 352. If the first switch 306 and the second switch 308 are constructed similar to each other, they may for example be identical, the currents flowing into the respective control terminals 344, 352 when they are conducting may be the same. The sum of the respective currents may therefore be constant over a respective switching period Tsw and may be independent of the duty cycle. If the first sub-driver 302 and the second sub-driver 304 are constructed similar to each other, they may for example be identical, the sum of the respective currents flowing into the respective first supply voltage terminals 312, 314 may also be constant over a respective switching period Tsw. The driver supply voltage 108 at the output 310 of the first circuit 102 may, be constant and independent from the switching frequency and the duty cycle. Further, only one first circuit 102 needs to be provided for a plurality of switches.

The first circuit 102 may have a first impedance at first frequencies. The first frequencies may for example be frequencies below the switching frequency. Such frequencies may occur during steady state operations of the switching elements. The switching elements may for example be in a steady state operation when they have been turned on long enough that any transients in the current or voltage that are caused by turning the switching element ON have decayed. The state of the switching elements may be called a steady-state or conducting state or ON-state. The first frequencies may be considered as low frequencies. They may be smaller than an operating frequency fsw or switching frequency fsw of the switch circuit arrangement. The first impedance at the first frequencies may be chosen so that sufficient current flows to keep one of the switching elements in a conducting state or an ON-state. For example, the first impedance may have a magnitude of 30Ω and may be called a high impedance.

The first circuit 102 may have second impedances at second frequencies. The second frequencies may for example be frequencies of transients, for example of switching transients. Transients may be caused by a sudden change in state, for example the sudden turning on (or sudden turning off), of a switching element. Transients may have oscillations that usually last for a short time, for example until a steady state is reached. The second frequencies may usually be much higher than the first frequencies and higher than the operating frequencies fsw and may be called high frequencies or transient frequencies.

The second impedances may be smaller than the first impedances and may be called low impedances. For example, they may be smaller than the first impedances by a factor of 100 to 1000. They may for example have a magnitude of 0.03 to 0.3Ω. The low impedances allow a large current to flow so that the change from a non-conducting state or OFF-state to a conducting or ON-state is fast and switching losses may be reduced.

The first circuit 102 may for example include a parallel connection of a resistor and a capacitor, which may be called a RC circuit. During low frequencies, the impedance of the parallel RC circuit will be dominated by the resistance R of the resistor as the impedance of the capacitor increases with lower frequencies to become a parallel connected open circuit. At low frequencies, the resistor may be thought of as a bypass to the capacitor. The resistance R may limit the current flow during steady state (or conducting state or ON state), for example to a value needed to keep the switching element conducting.

During high frequencies, the impedance of the RC circuit will be dominated by the capacitor as the impedance of the capacitor decreases with higher frequencies. At high frequencies, the capacitor may be thought of as a bypass to the resistor. The capacitance C may be chosen to allow large currents to flow at high frequencies, for example at transient frequencies. The current may for example need to be large enough so that the time needed for charging the switching element from an OFF-state to an ON-state may be reduced to a desired level, usually a minimum level.

The first circuit 102 may receive the positive supply voltage 104 from the power supply 106. The first circuit (e.g. the RC circuit) 102 may thus be connected into the (common) voltage supply of the driver 110, which may include a plurality of sub-drivers 302, 304, as described above.

In this implementation 400, the respective components of the circuit arrangement 300 may be configured as follows:

The supply voltage VS 104 may be selected such that it is e.g. in the range from about 0.5 V to about 2.0 V above a highest possibly occurring gate voltage VG of the switches 306, 308 (e.g. transistor switches 306, 308) of the switch circuit 112 at a desired or predetermined gate current IG to the switches 306, 308 (e.g. transistor switches 306, 308) of the switch circuit 112. It may for example be 4.5 V.

A resistance R of the resistor of the RC circuit may then be calculated from the difference (VS−VG) and an average gate current Iav by:

$$R=(VS-VG)/Iav. \quad (1)$$

The average gate current Iav may be determined from the predetermined gate current IG and the gate charges Qh and Ql required to switch on the high side switch 306 (e.g. high side transistor switch 306) and the low side switch 308 (e.g. low side transistor switch 308), respectively, in accordance with:

$$Iav=IG+(Qh+Ql)*fsw. \quad (2)$$

A capacity C of the capacitor of the RC circuit may then be selected such that a frequency frc=1/(2π*RC) of the RC circuit 102 is lower, for example one magnitude lower, than the switching frequency fsw 404 of the circuit arrangement 100, 200, e.g. in accordance with:

$$C>10/(2*\pi*R*fsw). \quad (3)$$

As shown in FIG. 4, the driver supply voltage 108 may be provided for all sub-drivers 302, 304 (in general, more than two sub-drivers 302, 304, may be provided, e.g. three, four, five, six, or even more) provided in the circuit arrangement 100, 200.

In various embodiments, an optional bootstrap diode 406 may be connected between the output 310 of the first circuit 102 and the first supply voltage terminal 312 of the first sub-driver 302. The anode of the bootstrap diode 406 may be coupled to the output 310 of the first circuit 102 to receive the driver supply voltage 108. The cathode of the bootstrap diode 406 may be coupled to the first supply voltage terminal 312 of the first sub-driver 302.

Furthermore, an additional capacitor 408 may optionally be provided, e.g. connected between the cathode of the bootstrap diode 406 and the second supply voltage terminal 316 of the first sub-driver 302. The additional capacitor 408 may be considered as a bootstrapping capacitor 408.

Furthermore, a node 410 between the output 310 of the first circuit 102 and the anode of the bootstrap diode 406 may be coupled to the first supply voltage terminal 314 of the second sub-driver 304, wherein the second supply voltage terminal 320 of the second sub-driver 304 may be coupled to the reference potential 322 (e.g. may be grounded).

In many applications having half bridge configurations or half bridge circuit(s), the energy required for the switching of e.g. both (power) transistors is often taken from a single driver supply (bootstrap concept). As described above, the sum of the gate currents provided by the driver and thus the energy required per period may be substantially constant and e.g. independent from a duty cycle of a switching action. Thus, a first circuit provided in the power supply line may be designed or configured for a very low cut-off frequency frc, for example much smaller than fsw, without a frequency dependency or duty cycle dependency of an operation point of the switching element.

Illustratively, the first circuit 102 needs only be effective for an activation operation and/or during an ON-state of the switching elements. Deactivation operations of the switching elements are not influenced by the first circuit. Individual output pins, which are provided in some drivers to implement different impedances for activation (switching on) and deactivation (switching off) of the transistor switch, respectively, may no longer be necessary.

The expense of driver-external components is very low: (exactly) one RC circuit may be sufficient for (exactly) one half bridge circuit.

In many cases, a power supply for the incorporation of the first circuit may be more easily accessible and less sensitive than incorporating a circuit at an output of the driver circuit. This concept is e.g. applicable in case a transistor control voltage (e.g. a gate voltage), which appears due to the switch input characteristic, is suitable as a supply voltage for the driver.

Figure 5:
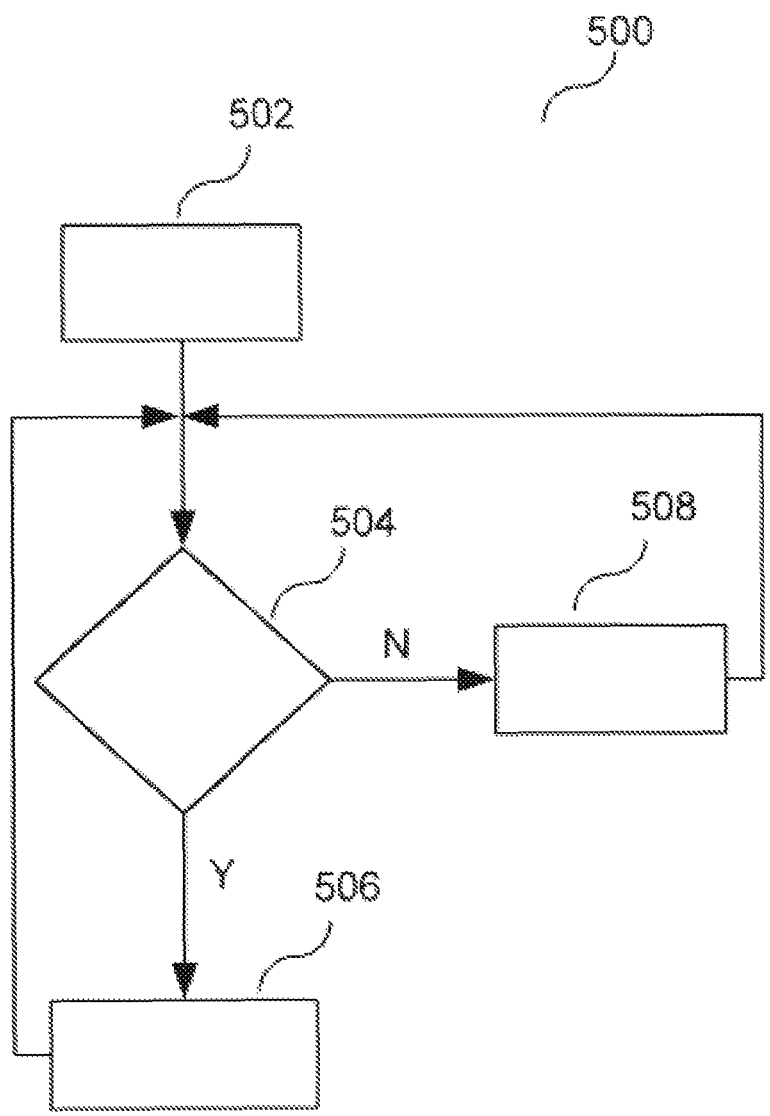
FIG. 5 shows a method for powering a driver circuit in accordance with various embodiments.

FIG. 5 shows an exemplary flowchart of a method 500 for powering a driver circuit configured to control a switch circuit. The driver circuit and the switch circuit may be the same or similar to the driver circuits and the switch circuits described above.

The method may include providing a voltage source with a first impedance to power the driver circuit when the switch circuit is in a steady state and providing a voltage source with a lower impedance than the first impedance to power the driver circuit during a change of state of the switch circuit. In various embodiments, the change of state may be the change of at least one switching element of the switch circuit from a non-conducting state to a conducting state. In various embodiments, at least one switching element of the switch circuit draws a current during steady state. In various embodiments, the first impedance and the second impedance are provided by a parallel connection of a resistor and a capacitor.

In 502, operation of the switch circuit arrangement may be started, for example by applying power and control signals to it.

In 504, it is determined how the driver circuit is to be powered. The decision may be made on basis of the state of the switch circuit. The state of the switch circuit may be determined by a control signal, for example a driver control signal, for example a high side control signal INH or a low side control signal INL.

If the switch circuit is in the steady state, for example if one of the switching elements is in a conducting (ON) state, the flowchart may continue with 506. If the switch circuit is not in the steady state, for example when the switch circuit changes its state, for example from a non-conducting (OFF) state to conducting (ON) state, the flowchart may continue with 508.

In 506, a voltage source with a first impedance may be used to power the driver circuit. Usually, only a small current is needed for operating the switching element in steady state. The first impedance may limit the current flow. It may be larger than an internal impedance of a voltage source. A series connection of the voltage source and the first impedance may therefore act like a current source, which may reduce operating point variations of transistors with diode-like control input characteristics.

In 508, a voltage source with a lower impedance than the first impedance, which may be called a second impedance, is used to power the driver circuit. The voltage source may be the same as in 506 and may be connected in series to the second impedance. The lower impedance allows the voltage source to provide more current to the switching element(s) in the switch circuit. This may be useful when switching states, since more current may be required to move electrical charges in the control inputs of the switching elements.

After some time, for example periodically, for example after a period Tsw of a switching frequency of the switch circuit arrangement, the flow returns to 504 and is repeated until the switch circuit arrangement is turned off.

In principle, the impedance of the voltage source may be varied by a switch (or more switches) coupled to the driver control signal, where the switch may for example be used to bypass a resistor. However, using additional switches and their control signals in the first circuit may be avoided by providing the first impedance and the second impedance by a parallel connection of a resistor and a capacitor, as described above.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A switch circuit arrangement, comprising:
a switch circuit;
a driver circuit configured to control the switch circuit;
a supply circuit configured to power the driver circuit, wherein the supply circuit comprises a first circuit configured to modify an output impedance of the supply circuit to have a first impedance when the driver circuit controls the switch circuit to be in a conducting state and to have a second impedance when the driver circuit controls the switch circuit to change from a non-conducting state to the conducting state;
wherein the first circuit comprises a frequency dependent element configured to provide a low impedance when changing from the non-conducting state to the conducting state and to have a high impedance during the conducting state;
wherein the frequency dependent element and a resistor are configured as a parallel connection; and
wherein an inverse of a time constant of the parallel connection is smaller than two PI times a switching frequency of the switch circuit arrangement, for example smaller than one tenth of two PI times the switching frequency of the switch circuit arrangement.

2. The switch circuit arrangement of claim 1,
wherein the supply circuit comprises a voltage source configured to have a voltage, for example 0.5 V to 2.0 V, above a highest control voltage of the switch circuit for a predetermined control current.

3. The switch circuit arrangement of claim 2,
wherein a resistance of the resistor is given by dividing a difference of the voltage of the voltage source and the highest control voltage by an average control current.

4. The switch circuit arrangement of claim 3,
wherein the average control current is given by a sum of the predetermined control current and a product of charges required for placing the switch circuit into the conduction state and the switching frequency of the switch circuit arrangement.

5. A switch circuit arrangement, comprising:
a half bridge circuit comprising a series connection of a first switching element and a second switching element;
a driver circuit comprising
a first driver element coupled to a supply circuit and configured to drive the first switching element; and
a second driver element coupled to the supply circuit and configured to drive the second switching element,
wherein the driver circuit is configured to control the half bridge circuit such that in a first phase the first switching element is in a conducting state and the second switching element is in a non-conducting state and in a second phase the first switching element is in a non-conducting state and the second switching element is in a conducting state; and
the supply circuit comprising a first circuit configured to power the first driver element and the second driver element, wherein the first circuit is configured to have a first impedance during the first phase and the second phase and to have an impedance lower than the first impedance during at least one of a change from the first phase to the second phase and a change from the second phase to the first phase.

6. The switch circuit arrangement of claim 5,
wherein the supply circuit comprises a series connection of a voltage source and a parallel connection comprising a capacitor and a resistor.

7. The switch circuit arrangement of claim 5,
wherein the first switching element and the second switching element are configured to draw a current in their respective conducting states.

8. The switch circuit arrangement of claim 5,
wherein the driver circuit comprises a voltage converter circuit, for example a bootstrap or a dc-dc converter coupled to the supply circuit and configured to drive the second driver element.

* * * * *